United States Patent
Murakami et al.

[11] Patent Number: 5,920,378
[45] Date of Patent: Jul. 6, 1999

[54] PROJECTION EXPOSURE APPARATUS

[75] Inventors: Masaichi Murakami, Machida; Hiroshi Shirasu; Tomohide Hamada, both of Yokohama; Kazuaki Saiki; Susumu Mori, both of Tokyo, all of Japan

[73] Assignee: Nikon Corporation, Tokyo, Japan

[21] Appl. No.: 08/853,389

[22] Filed: May 9, 1997

Related U.S. Application Data

[63] Continuation-in-part of application No. 08/615,853, Mar. 12, 1996, Pat. No. 5,715,037.

[30] Foreign Application Priority Data

May 10, 1996 [JP] Japan ................................ 8-116249

[51] Int. Cl.$^6$ .......................... G03B 27/42; G01B 11/00
[52] U.S. Cl. ........................... 355/53; 355/67; 356/400; 250/548
[58] Field of Search .................. 355/43–45, 53, 355/67; 356/399–401; 250/548

[56] References Cited

U.S. PATENT DOCUMENTS

| | | | |
|---|---|---|---|
| 4,855,792 | 8/1989 | Holbrook et al. | 355/53 |
| 5,151,749 | 9/1992 | Tanimoto et al. | 250/548 |
| 5,243,195 | 9/1993 | Nishi | 250/548 |
| 5,309,197 | 5/1994 | Mori et al. | 355/53 |
| 5,506,684 | 4/1996 | Ota et al. | 356/401 |
| 5,579,147 | 11/1996 | Mori et al. | 359/204 |
| 5,715,037 | 2/1998 | Saiki et al. | 355/53 |
| 5,751,404 | 5/1998 | Murakami et al. | 355/53 |

FOREIGN PATENT DOCUMENTS 63-108718 5/1988 Japan ........................ H01L 21/30

*Primary Examiner*—D. Rutledge
*Attorney, Agent, or Firm*—Chapman and Cutler

[57] ABSTRACT

A projection exposure apparatus includes off-axis type plate alignment systems which make it possible to reduce alignment time and thereby increase throughput. Exposure of large photosensitive plates is made possible without increasing the length of the plate stage stroke. Multiple fiducial mark members including fiducial mark members in different positions on a plate stage are utilized. Multiple off-axis type plate alignment systems are used to observe the multiple fiducial marks.

20 Claims, 4 Drawing Sheets

PROJECTION EXPOSURE APPARATUS

This application is a continuation-in-part of our prior, application Ser. No. 615,853, filed on Mar. 12, 1996, and issued on Feb. 3, 1998, as U.S. Pat. No. 5,715,037.

BACKGROUND OF THE INVENTION

1. Field of the Invention

The present invention relates to a projection exposure apparatus used in the manufacture of semiconductor elements and liquid-crystal displays and, in particular, a projection exposure apparatus which includes an off-axis type plate alignment system.

2. Description of Related Art

In a projection exposure apparatus having an off-axis type plate alignment system, a fiducial mark member having a reference mark is fixed on a plate stage which moves two-dimensionally while holding a photosensitive plate consisting of a wafer, glass plate, or similar element coated with a sensitizer such as a photoresist. The fiducial mark members are used to control a baseline value of the distance between the off-axis alignment system and the projection optical system.

FIG. 5 is a diagram which illustrates the principles of baseline measurement with a conventional projection exposure apparatus. As illustrated in FIG. 5 (a), reticle marks (RMa) and (RMb) are formed on a mask (10) at positions which are symmetrical with respect to the mask center (C). The mask (10) is held by a mask stage (11). The mask stage (11) is moved so as to align the mask center (C) of the mask (10) with the optical axis (AX) of a projection optical system (20). A fiducial mark member (FP), comprising a fiducial mark (FM) which is equivalent to an alignment mark formed on the surface of the photosensitive plate, is attached on a plate stage (31) at a position in which it does not interfere with the photosensitive plate. When the plate stage (31) is positioned so that the fiducial mark (FM) moves to the desired position in the imaging field of the projection optical system (20), the mark (RMa) of the mask (10) and the fiducial mark (FM) will be detected at the same time by a TTL (through-the-lens) type mask alignment system (50a) situated above the mask (10). In addition, when the plate stage (31) is moved to another position, it is possible to detect the mark (RMb) of the mask (10) and the fiducial mark (FM) at the same time by a mask alignment system (50b).

An off-axis type plate alignment system (60) is rigidly mounted outside of the projection optical system (20) (outside the imaging field). The optical axis of the plate alignment system (60) is parallel to the optical axis (AX) of the projection optical system (20) on the projected image plane. A target mark, serving as a reference in aligning the marks on the photosensitive plate or the fiducial mark (FM), is formed on a glass plate inside the plate alignment system (60), and is arranged substantially in conjugation with the projected image plane (the photosensitive plate surface or the surface of the fiducial mark (FM)).

As illustrated in FIG. 5 (b), a laser interferometer is used to measure the position $X_1$ of the plate stage (31) when the mark (RMa) of the mask (10) and the fiducial mark (FM) on the fiducial mark member (FP) are aligned by the mask alignment system (50a). Likewise, a laser interferometer and other elements are used to measure the position $X_2$ of the plate stage (31) when the mark (RMb) of the mask (10) and the fiducial mark (FM) are aligned by the mask alignment system (50b) as well as the position $X_4$ of the plate stage (31) when the target mark of the plate alignment system (60) and the fiducial mark (FM) are aligned. If the midpoint between the positions $X_1$ and $X_2$ is $X_3$, then the position $X_3$ is located on the optical axis (AX) of the projection optical system (20), and is in a position conjugate with the reticle center (C).

The baseline value (BL) is determined by calculating the difference $(X_3-X_4)$. The baseline value (BL) is the reference value for subsequently aligning the alignment marks on the photosensitive plate using the plate alignment system (60) and feeding them immediately beneath the projection optical system (20). More specifically, if the distance between the center of the single shot (exposed area) on the photosensitive plate and the alignment mark on the photosensitive plate is XP, and if $X_5$ is the position of the plate stage (31) when the alignment mark on the photosensitive plate is matched with the target mark of the off-axis type plate alignment system (60), then the plate stage (31) should be moved to the position obtained from the following expression in order to match the shot center with the mask center (C).

$$(X_5-BL-XP) \text{ or } (X_5-BL+XP)$$

Thus, after the alignment mark position on the photosensitive plate is detected using the off-axis type plate alignment system (60), it is only necessary to feed the plate stage (31) by a certain amount related to the baseline value (BL) in order to immediately and accurately position the pattern of the mask (10) over the shot area on the photosensitive plate for exposure. It should be noted that although this discussion pertains only to one dimension, in actual practice it is necessary to consider two dimensions.

Conventional projection exposure apparatuses situate only one fiducial mark member with a fiducial mark in a position which does not interfere with a photosensitive plate on a plate stage. As a result, various problems arise. As the size of the photosensitive plate increases, the plate stage begins to have an unnecessarily long stroke in order to perform exposure. The size of the photosensitive plate is otherwise restricted by a limited stroke. Restrictions on the positioning of the alignment system, which handles positioning between layers that are stacked and exposed, are also present.

Projection exposure apparatuses used in the manufacture of, for example, liquid-crystal displays produce increases in display sizes and have caused an increase in the size of the photosensitive plate (glass plate). As a result, the size of the plate stage on which the plate is set has also increased, gradually lengthening the stroke of the plate stage. At the same time, the alignment marks formed on the plate are, in many cases, situated on the periphery of the plate for purposes such as increasing the span between marks for improved measurement accuracy, or integrating the alignment process through the formation of marks which are always in the same position on the plate regardless of the device layout. When a single off-axis plate alignment system is used to detect alignment marks situated on both ends of this type of large plate, the stroke of the plate stage must be made extremely long. This makes plate stage design difficult. At the same time, it increases the likelihood of a decrease in throughput. The use of off-axis plate alignment systems at both ends of the projection optical system may be considered in order to avoid increasing the length of the plate stage stroke. Although the use of two plate alignment systems does not require a long stroke during the alignment process, however, the plate stage must still have a long stroke in order to calibrate the two plate alignment systems using fiducial marks through conventional techniques.

SUMMARY OF THE INVENTION

The present invention has been designed after consideration of the problems in the prior art such as those discussed above. The primary objective of this invention is to provide a projection exposure apparatus with an off-axis plate alignment system which makes it possible to reduce alignment time, increase throughput, and expose a large photosensitive plate without increasing the length of the plate stage stroke.

The present invention achieves the aforementioned objective by utilizing multiple fiducial mark members having fiducial marks in different positions on a plate stage. Multiple off-axis plate alignment systems, which are capable of observing the multiple fiducial marks, are utilized.

The projection exposure apparatus of the present invention includes a plate stage which is movable two-dimensionally while holding a photosensitive plate and a projection optical system which projects a mask pattern image onto the optical substrate. A first off-axis type plate alignment system has a first detection area situated in a location which is at a distance from the optical axis of the projection optical system and detects alignment marks on the photosensitive plate. A second off-axis type plate alignment system, which has a second detection area situated in a location which is different from that of the first detection area and is at a distance from the optical axis of the projection optical system, also detects alignment marks on the photosensitive plate. A first fiducial mark member for the first plate alignment system includes a fiducial mark detectable by the first plate alignment system and is situated on the plate stage. A second fiducial mark member for the second plate alignment system has a fiducial mark detectable by the second plate alignment system and is situated on the plate stage in a location different from that of the first fiducial mark member.

The distance between the first fiducial mark member and the second fiducial mark member on the plate stage is determined by the distance between the first detection area and the second detection area. The first fiducial mark member and the second fiducial mark member should be positioned so that the plate stage stroke is as short as possible during baseline measurement and calibration between the first and second off-axis plate alignment systems. One method is to set L so that the following expression is satisfied, where L is the distance between the first fiducial mark member and the second fiducial mark member on the plate stage, La is the distance between the first detection area and the second detection area of the plate alignment systems, and Lb is the distance between the two projection positions projected where the projection optical system projects onto the plate stage the two alignment marks formed on the mask in conjunction with the fiducial mark of the first fiducial mark member and the fiducial mark of the second fiducial mark member.

$$Lb<L<La$$

The first detection area and second detection area of the plate alignment systems can each be arranged outside the imaging field of the projection optical system.

In addition, if the fiducial mark members are arranged so that they can be moved up and down with respect to the plate stage, it will be possible to avoid interference with the photosensitive plate which is to be set on the plate stage.

With the present invention, multiple fiducial mark members having fiducial marks are situated on a plate stage, thereby making it possible to set the distance between the off-axis plate alignment systems to at least the length of the plate stage stroke. As a result, the plate stage must merely have a stroke which is effective for the increased size of the photosensitive plate. It is not necessary to have an excessively long stroke. In addition, there are no restrictions on the positioning of the alignment systems.

DESCRIPTION OF THE PREFERRED EMBODIMENTS

Figure 1:
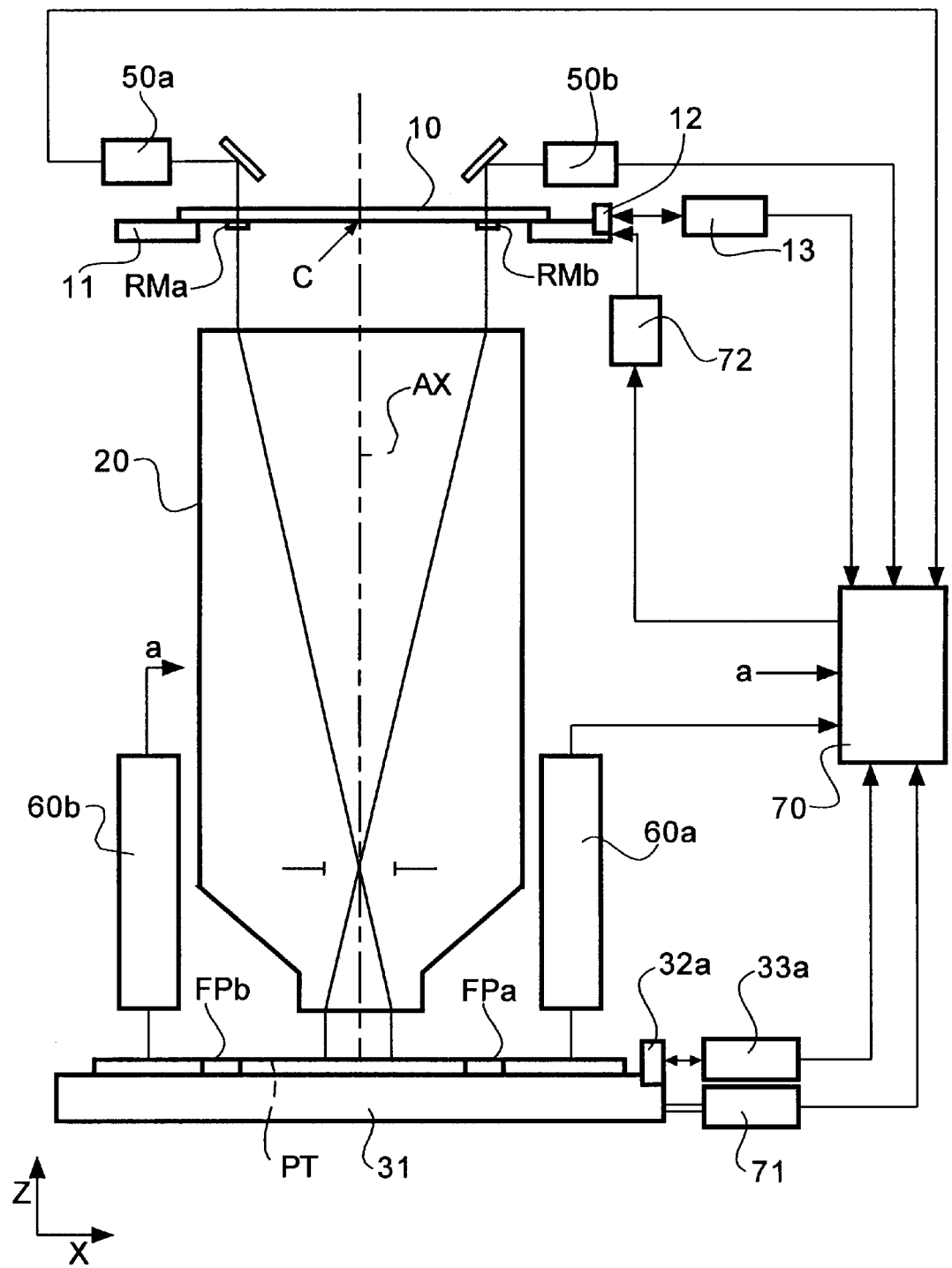
FIG. 1 is a schematic illustration of the projection exposure apparatus of the present invention.
Figure 2:
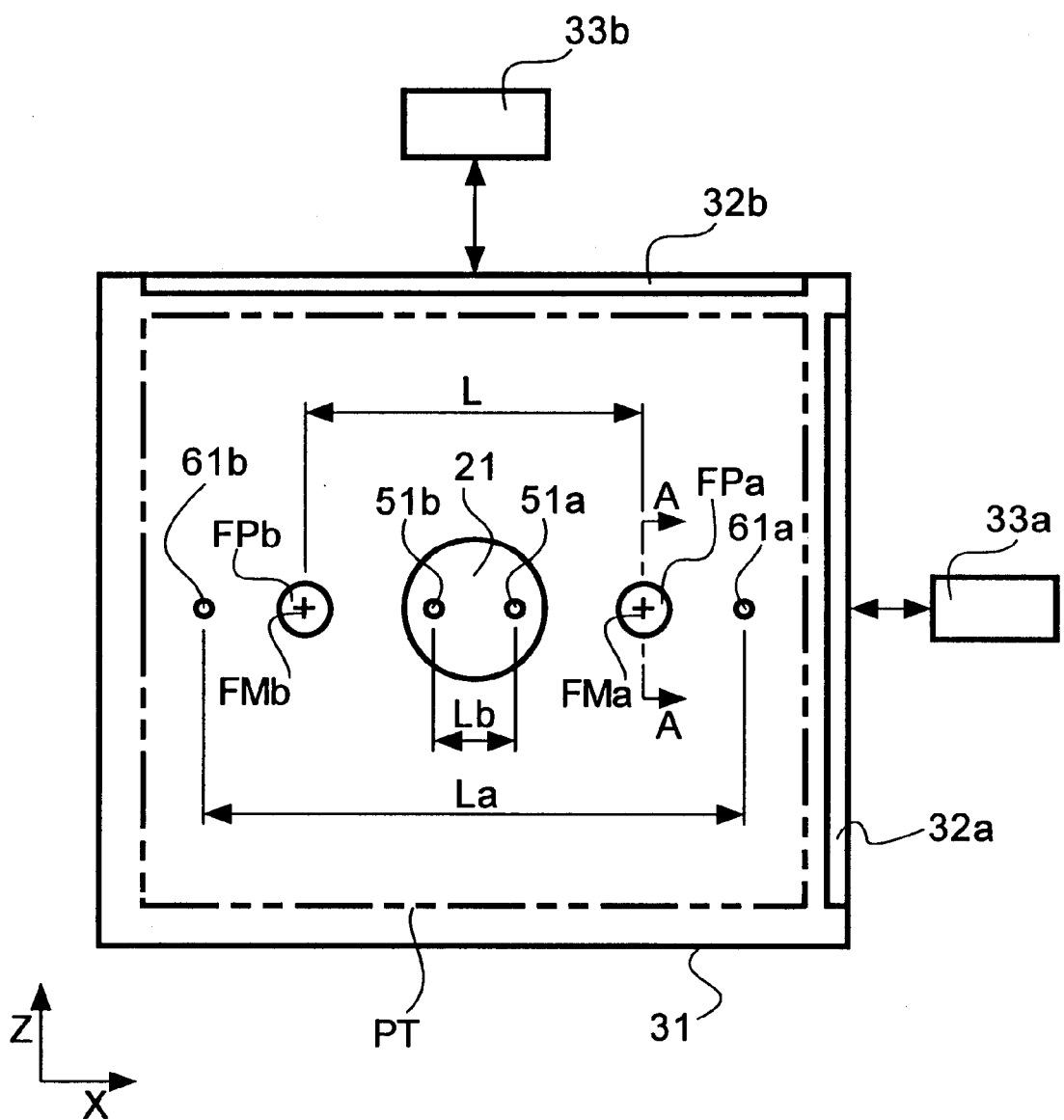
FIG. 2 is a schematic plan view of the plate stage.

FIG. 1 is a schematic illustration of an example of the projection exposure apparatus of the present invention. FIG. 2 is a schematic plan view of its plate stage. The projection exposure apparatus of this embodiment is an exposure apparatus particularly appropriate for use in the manufacture of liquid-crystal displays. This projection exposure apparatus comprises two off-axis type plate alignment systems (60a) and (60b). A first fiducial mark member (FPa) having a fiducial mark for the first off-axis plate alignment system (60a) and a second fiducial mark member (FPb) having a fiducial mark for the second off-axis plate alignment system (60b) are formed on the plate stage (31). A pair of TTL (through-the-lens) type mask alignment systems (50a) and (50b) are situated above the mask (10). The structure and functions of the plate alignment systems (60a) and (60b) and the mask alignment systems (50a) and (50b) are the same as those of the prior art.

When the mask (10), which is held on the mask stage (11), is irradiated with exposure light from a lighting system (not shown), the projection optical system (20) projects an image of the pattern formed on the mask (10) onto a photosensitive rectangular glass plate (PT) which is situated on the plate stage (31) as indicated by the dotted line.

Movable mirrors (32a) and (32b) are fixed on the plate stage (31), which is movable two-dimensionally. The distances between the movable mirrors (32a) and (32b) and laser interferometers (33a) and (33b) are calculated in measuring the two-dimensional position of the plate stage (31). A main control system (70) servo-controls a drive (71) such as a motor while monitoring the position of the plate stage (31) based on the output of the laser interferometers (33a) and (33b), so as to move the plate stage (31) to the desired position. Like the plate stage (31), a movable mirror (12) is attached to the mask stage (11). The distance between it and the movable mirror (12) is measured by a laser interferometer (13). The output of the laser interferometer is referenced by the main control system (70) in moving the mask (10) to the desired position using driving means (72) such as a motor.

Two fiducial mark members (FPa) and (FPb), comprising fiducial marks (FMa) and (FMb) which are equivalent to alignment marks formed on the surface of the photosensitive plate, are situated on the plate stage (31) so that they can move up and down with respect to the plate stage (31) as described below. The plate stage (31) is positioned so that the fiducial mark (FMa) of the fiducial mark member (FPa) or the fiducial mark (FMb) of the fiducial mark member (FPb) reaches the desired position inside the imaging field (21) of the projection optical system (20). This makes it possible for the mask alignment system (50a) or (50b) situated above the mask (10) to detect one of the marks (RMa) or (RMb) of the mask (10) and the fiducial mark (FMa) or (FMb) simultaneously.

A pair of off-axis plate alignment systems (60a) and (60b) including detection areas (61a) and (61b) are rigidly mounted outside the imaging field (21) of the projection optical system (20) so as to sandwich the diameter of the projection optical system (20), for example. The imaging field (21) of the projection optical system (20), the detection areas of the plate alignment systems (60a) and (60b), the positions (51a) and (51b) which are conjugate with the projection optical system (20) on the alignment marks (RMa) and (RMb) of the mask (10) and are observed by the mask alignment systems (50a) and (50b), and the first and second fiducial mark members (FPa) and (FPb) are positioned as shown in FIG. 2, for example, when the center of the plate stage (31) is positioned on the optical axis (AX) of the projection optical system (20).

Distances L, La, and Lb satisfy the following relationship, where L is the distance between the fiducial mark (FMa) formed on the first fiducial mark member (FPa) and the fiducial mark (FMb) formed on the second fiducial mark member (FPb), La is the distance between the detection areas (61a) and (61b) of the two plate alignment systems (60a) and (60b), and Lb is the distance between the two projection positions (51a) and (51b) projected where the projection optical system (20) projects onto the plate stage the two alignment marks (RMa) and (RMb) formed on the mask.

$$Lb<L<La$$

The right-side plate alignment system (60a) receives the alignment mark formed on the right-end area of the photosensitive plate (PT) which is set on the plate stage (31). The left-side plate alignment system (60b) receives the alignment mark formed on the left-end area of the photosensitive plate (PT). The two plate alignment systems (60a) and (60b) may be set in positions in which it is possible simultaneously to observe the alignment marks formed on the left and right ends of the photosensitive plate. It is also possible to attach three or more such plate alignment systems in order simultaneously to observe multiple alignment marks formed on the left and right-end areas of a photosensitive plate.

With the projection exposure apparatus shown in the diagrams, the fiducial mark members (FPa) and (FPb) are situated inside the plate setting surface of the plate stage (31). Thus the fiducial mark members (FPa) and (FPb) are set so that they can be raised or lowered with respect to the plate stage using an elevating device. During baseline measurement or calibration of the plate alignment systems (60a) and (60b) and mask alignment systems (50a) and (50b), the mark members are allowed to protrude beyond the plate stage (31) so that the mark surfaces are at the same height as the photosensitive plate surface. During ordinary exposure processes, the mark members are retracted inside the plate stage (31) so that they do not interfere with the photosensitive plate.

Figure 3:
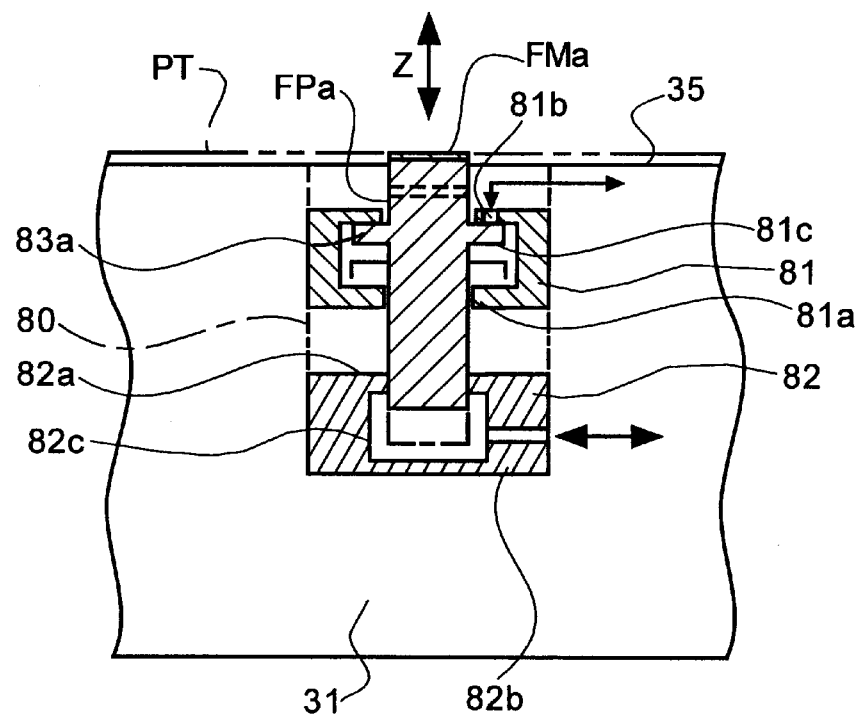
FIG. 3 is a cross section along A—A in FIG. 2.

FIG. 3 is a cross section along line A—A in FIG. 2 which illustrates an example of the fiducial mark member elevating device. Although this discussion pertains to the fiducial mark member (FPa), the other fiducial mark member (FPb) is also raised and lowered by the same type of elevating device. A hole (80) is formed on the plate stage position where the fiducial mark member (FPa) is to be situated. A first guide member (81) and a second guide member (82) are situated therein. The first guide member (81) includes a guide part (81a), a hole (81b) which is connected to an air pipe (not shown), and a cylinder (81c). The second guide member (82) includes a guide part (82a), a hole (82b) which is connected to an air pipe (not shown), and a cylinder (82c). Air is supplied to the hole (81b) or the hole (82b), thereby driving the fiducial mark member (FPa), which comprises, on its top surface, the fiducial mark (FMa). The mark member (FPa) is driven along the z-axis as it is guided by the first guide member (81) and second guide member (82).

The positional relationship between the top of the cylinder (81c) and an air receiving collar (83a), which moves inside the cylinder (81c) of the guide member (81), is such that when the fiducial mark member (FPa) is in the raised position indicated by the solid line, the fiducial mark (FMa) formed on the surface thereof is at the same height as the surface of the photosensitive plate (PT) which is set on the plate setting surface (35) on the plate stage (31). When the fiducial mark member (FPa) is in the lowered position indicated by the dotted line, even if the photosensitive plate (PT) is set on the plate setting surface (35) of the plate stage (31), the fiducial mark (FMa) will retract to a position in which there is no interference with the photosensitive plate (PT). Thus, when air is supplied through the hole (82b) of the second guide member (82), thereby applying an upward propulsion to the bottom of the fiducial mark member (FPa), air is sucked through the hole (81b) of the first guide member, causing the air receiving collar (83a) to touch the top of the cylinder (81c) of the first guide member (81). As a result, the fiducial mark (FMa) of the fiducial mark member (FPa) rises to the same position as the photosensitive plate surface when a photosensitive plate (PT) is set on the plate stage (31). It is then fixed in that position. When air is sucked through the hole (82b) of the second guide member (82) and air is simultaneously supplied to the hole (81b) of the first guide member (81), the fiducial mark member (FPa) will retract to a noninterfering position even if a photosensitive plate (PT) is set in place. It should be noted that the fiducial mark members may also be moved up and down in other ways such as with a motor.

An example of the alignment process using the plate alignment systems (60a) and (60b) and the mask alignment systems (50a) and (50b) will now be described. The position of the plate stage (31) is measured by the laser interferometers (33a) and (33b). The plate stage is drive-controlled by a driving apparatus (71) under the control of the main control system (70).

The plate stage (31) is moved so that the fiducial mark (FMa), formed on the fiducial mark member (FPa) of the plate stage (31), enters the field (51a) of the mask alignment system (50a). The mask (10) is aligned using the fiducial mark (FMa) and the mark (RMa) of the mask (10), and its positional information is mapped onto a plate stage motion coordinate system, which is defined by the measurement values of the laser interferometers (33a) and (33b) of the plate stage (31). The plate stage (31) is then driven so that the fiducial mark (FMa) will be positioned on the detection area (61a) of the plate alignment system (60a). The fiducial mark (FMa) is then measured by the plate alignment system (60a). Likewise the positional information of the plate alignment system (60a) is mapped onto the plate stage motion coordinate system.

The same process is then performed using the fiducial mark (FMb), which is formed on the other fiducial mark member (FPb). The fiducial mark (FMb) is used to measure the mask (10), which has already been aligned using the fiducial mark (FMa). The position of the plate alignment system (60b) is then measured. Specifically, the mark (RMA) of the mask (10) and the fiducial mark (FMb) are used in the mask alignment system (50a) to align the mask (10). The positional information is then mapped onto the plate stage motion coordinate system. Next, the plate alignment system (60b) is used to measure the fiducial mark (FMb), and the positional information of the plate alignment system (60b) is then mapped onto the plate stage motion coordinate system.

One fiducial mark (FMa) is thus used to align the mask (10) and a plate alignment system, while the other fiducial mark (FMb) is used to align the same mask (10) with the plate alignment system (60b). As a result, the relative positions of all of the alignment systems are determined on the plate stage motion coordinate system via the mask alignment systems (50) for calibrating the alignment systems.

Next the photosensitive plate (PT) is fed to the plate stage (31), where it is exposed after alignment by the plate alignment systems (60a) and (60b). The plate alignment systems (60a) and (60b) each handle the process of detecting the alignment marks located in the vicinities of their respective detection areas.

With the layout shown in FIG. 2, the fiducial mark members (FPa) and (FPb) are positioned so that the fiducial mark (FMa) is situated near the midpoint between the detection area (61a) and projection position (51b), and the fiducial mark (FMb) is situated near the midpoint between the detection area (61b) and projection position (51a). If L is set so that the expression shown below is satisfied, then it is possible to reduce the amount of movement of the plate stage (31) when the alignment systems are calibrated.

$$L \approx (La - Lb)/2$$

Figure 4:
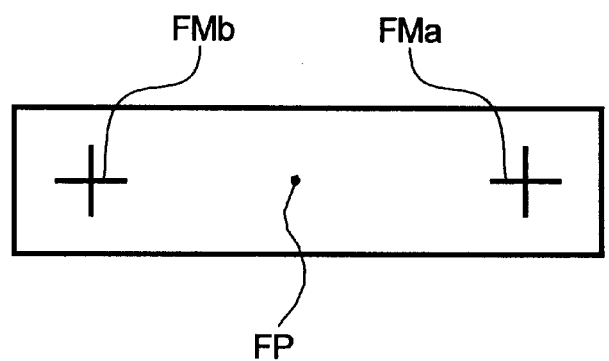
FIG. 4 is a diagram illustrating another example of fiducial mark members and fiducial marks.
Figure 5A:
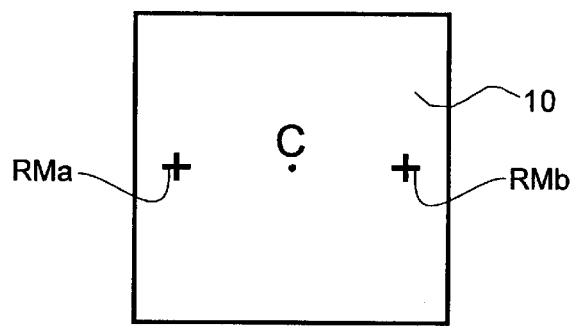
FIG. 5 is an illustration of baseline measurement with a conventional projection exposure apparatus.
Figure 5B:
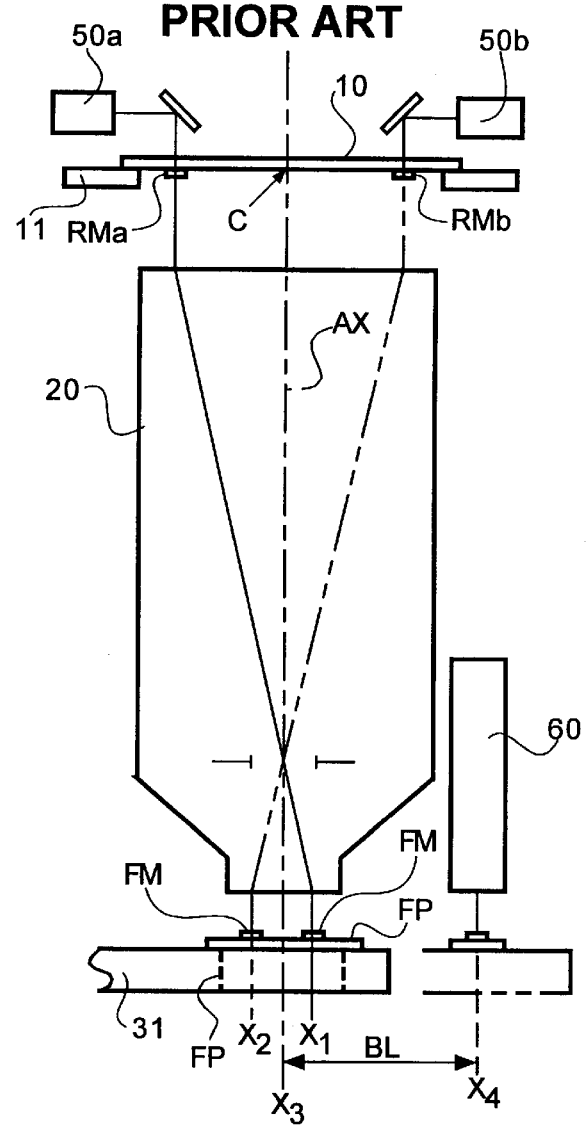

It should be noted that the fiducial mark members formed on the plate stage may include one fiducial mark for each fiducial mark member or, as shown in FIG. 4, may comprise multiple fiducial marks (FMa) and (FMb) for each fiducial mark member (FP).

It should be noted that in the discussion of the embodiments presented above, it was assumed that the relationship between the positions of the fiducial marks (FMa) and (FMb) was already known. It is possible to detect the relationship between the positions of the fiducial marks (FMa) and (FMb) based on the laser interferometer measurements when the fiducial marks (FMa) and (FMb) are sequentially positioned in the center of the field of, for example, one of the mask alignment systems (50a).

With the present invention, it is possible to adapt to larger photosensitive plates and improve throughput without unnecessarily lengthening the plate stage stroke. In addition, because restrictions on positioning of the alignment systems are reduced, it is possible to increase the measurement span and thereby improve the positioning precision.

We claim:

1. A projection exposure apparatus comprising:
    a plate stage which is movable two-dimensionally while holding a photosensitive plate;
    a projection optical system which images a mask pattern on the photosensitive plate;
    a first plate alignment system which has a first detection area situated in a location which is at a distance from the optical axis of the projection optical system;
    a second plate alignment system which has a second detection area situated in a location which is different from that of the first detection area;
    a first reference mark member for the first plate alignment system which includes a reference mark detectable by the first plate alignment system and is situated on the plate stage; and
    a second reference mark member for the second plate alignment system which includes a reference mark detectable by the second plate alignment system and is situated on the plate stage in a location different from that of the first reference mark member.

2. The projection exposure apparatus of claim 1, wherein a distance between the first reference mark member and the second reference mark member on the plate stage is determined by a distance between the first detection area and the second detection area.

3. The projection exposure apparatus of claim 1, wherein a distance between the first reference mark member and the second reference mark member on the plate stage is less than a distance between the first detection area and the second detection area.

4. The projection exposure apparatus of claim 1, wherein the first detection area and the second detection area are each set outside an imaging field of the projection optical system.

5. The projection exposure apparatus of claim 1, wherein the reference mark members are set so as to be movable vertically with respect to the plate stage.

6. The projection exposure apparatus of claim 2, wherein the distance between the first reference mark member and the second reference mark member on the plate stage is less than the distance between the first detection area and the second detection area.

7. The projection exposure apparatus of claim 2, wherein the first detection area and the second detection area are each set outside an imaging field of the projection optical system.

8. The projection exposure apparatus of claim 3, wherein the first detection area and the second detection area are each set outside an imaging field of the projection optical system.

9. The projection exposure apparatus of claim 2, wherein the reference mark members are set so as to be movable vertically with respect to the plate stage.

10. The projection exposure apparatus of claim 3, wherein the reference mark members are set so as to be movable vertically with respect to the plate stage.

11. The projection exposure apparatus of claim 4, wherein the reference mark members are set so as to be movable vertically with respect to the plate stage.

12. An exposure method for projecting an image of patterns formed on a mask through a projection optical system onto a substrate held on a substrate stage, said exposure method comprising the steps of:
    providing a first reference mark member having a first reference mark on the substrate stage;
    providing a second reference mark member having a second reference mark situated in a location which is different from that of the first reference mark member on the substrate stage;
    detecting a distance relating to that between the center of the projected image formed through the projection optical system and the center of a substrate detector, located adjacent the projection optical system, for detecting one of the first reference mark and the second reference mark; and
    projecting the image of patterns formed on the mask through the projection optical system onto the substrate held on the substrate stage.

13. The method of claim 12, and further comprising the step of determining a first distance between the first reference mark member and the second reference mark member on the plate stage by using a second distance between a first plate alignment system detection area and a second plate alignment system detection area.

14. The method of claim 12, and further comprising the step of setting first and second plate alignment system detection areas outside an imaging field of the projection optical system.

15. The method of claim 12, and further comprising the step of setting the reference mark members so as to be movable vertically with respect to the substrate stage.

16. The method of claim 13, and further comprising the step of setting the first and second detection areas outside an imaging field of the projection optical system.

17. The method of claim 13, and further comprising the step of setting the reference mark members so as to be movable vertically with respect to the substrate stage.

18. The method of claim 14, and further comprising the step of setting the reference mark members so as to be movable vertically with respect to the substrate stage.

19. The method of claim 13, wherein said first distance is less than said second distance.

20. The method of claim 16, wherein said first distance is less than said second distance.

* * * * *

UNITED STATES PATENT AND TRADEMARK OFFICE
CERTIFICATE OF CORRECTION

PATENT NO.    : 5,920,378
DATED         : July 6, 1999
INVENTOR(S)   : Masaichi Murakami, et. al.

It is certified that error appears in the above-identified patent and that said Letters Patent is hereby corrected as shown below:

Title page, under Foreign Application Priority Data item [30] add – Mar. 14, 1995 [JP] Japan......... 7-054210--

Signed and Sealed this

Twenty-eighth Day of December, 1999

Attest:

Q. TODD DICKINSON

*Attesting Officer*      *Acting Commissioner of Patents and Trademarks*